(12) United States Patent  
Evans et al.

(10) Patent No.: US 6,664,814 B1
(45) Date of Patent: Dec. 16, 2003

(54) OUTPUT DRIVER FOR AN INTEGRATED CIRCUIT

(75) Inventors: William P. Evans, Catonsville, MD (US); Luca Ravezzi, Columbia, MD (US); Alberto Baldisserotto, Apex, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 10/199,749

(22) Filed: Jul. 18, 2002

(51) Int. Cl.[7] .................................................. H03K 5/22
(52) U.S. Cl. .......................... 327/65; 327/563; 330/258
(58) Field of Search ................................. 330/258, 259, 330/252; 327/63, 65, 66, 67, 77, 89, 560–563, 108

(56) References Cited

U.S. PATENT DOCUMENTS

| | | | | | |
|---|---|---|---|---|---|
| 4,105,942 A | * | 8/1978 | Henry | ........................ | 330/258 |
| 4,528,517 A | * | 7/1985 | Schlotzhauer | ............... | 330/258 |
| 5,990,743 A | * | 11/1999 | Gabara | ........................ | 330/258 |
| 6,064,261 A | * | 5/2000 | Stein et al. | .................. | 330/252 |
| 6,265,941 B1 | * | 7/2001 | Lopata | ........................ | 330/259 |

* cited by examiner

Primary Examiner—Toan Tran
(74) Attorney, Agent, or Firm—Bingham McCutchen LLP

(57) ABSTRACT

A circuit and method for driving the output signal, having a common-mode voltage and an output swing, of an integrated circuit. In accordance with an aspect of an embodiment of the present invention, a first power supply provides the termination voltage for the output signal and a second power supply provides the power to set the common mode voltage. In accordance with another aspect, the common-mode voltage and the output swing are programmable.

32 Claims, 3 Drawing Sheets

OUTPUT DRIVER FOR AN INTEGRATED CIRCUIT

BACKGROUND AND SUMMARY

Generally, when interconnecting integrated circuits (ICs), output drivers are used to drive the output signal of one IC to be received by another IC, as illustrated in FIG. 1. A conventional IC 1 generates an IC signal and an output driver 2 receives the IC signal and generates a corresponding output signal that can be received and read by another IC.

For high-speed IC designs, a common type of output driver 2 is a serial line driver, which receives the IC signal and drives the output signal in a serial manner. Turning to FIG. 2, a portion of a conventional serial line driver 10 is shown. The driver 10 includes two n-channel metal-oxide semiconductor field-effect transistors (NMOSs) 50, which receive the IC signal at the gates 60 of the transistors 50 as a differential input signal, i.e., the input signal is the voltage difference between the gates 60. In the case of an IC 1 generating digital signals, e.g., 1's and 0's, the input signal may be either a high voltage on one gate 60 and a low voltage on the other gate 60 or vice versa and may swing between the two values depending on the signal that the IC 1 generates.

The output signal 40 is generated as a differential output signal at the drains 35 of the transistors 50—the output signal is the termination voltage difference between the drains 35. In the case of an IC 1 generating digital signals, the output signal may swing between a first value and a second value depending on the input signal, as described above. A common power supply 20 provides the termination voltage at the drains 35 through two equal valued resistors 30—typically around 50 ohms—one at each drain 35. A common current source 70, represented as a transistor, is coupled to the sources 45 of the transistors 50 and controls the voltage output swing of the output signal 40—the peak-to-peak voltage of the output signal 40.

There are several different industry input/output (I/O) standards for the differential output signal 40, such as the low voltage differential signaling (LVDS) and the low voltage transistor to transistor logic (LVTTL), and many of these standards are incompatible with each other. For example, output signals 40 conforming to one standard may have a different common mode voltage—referring to FIG. 2, the common mode voltage is the average voltage across the output signal 40, i.e., between the two drains 35—or a different output swing compared to other standards.

Most of the existing output drivers 2 conform only to a single I/O standard. However, there are some applications, such as programmable gate arrays (PGAs) where it may be desirable to have output drivers that conform to several different standards.

The present invention provides a method and mechanism for driving the output signal of an integrated circuit. According to an embodiment, the common mode voltage and the output swing of a differential output signal generated by an output driver may be programmable.

According to another embodiment, a first power supply is used to supply the termination voltage of the output signal, and a second power supply is used to adjust the common mode voltage.

With these aspects of the invention, the output driver may conform to several industry standards with efficient power usage. Further aspects, objects, and advantages of the invention are described below in the detailed description, drawings, and claims.

BRIEF DESCRIPTION OF THE DRAWINGS

The accompanying drawings are included to provide a further understanding of the invention and, together with the Detailed Description, serve to explain the principles of the invention.

DETAILED DESCRIPTION

The present invention is disclosed in an embodiment as a circuit for driving the output signal of an integrated circuit (IC). The embodiment is directed to a serial line driver having MOS-type transistors. However, the principles presented here are applicable to any output drivers having any type of transistors, such as output drivers having bipolar junction transistors that drive output signals in parallel, and thus the scope of the invention is not to be limited to the exact embodiments shown herein.

As described above, different I/O standards for serial line drivers, such as LVDS and LVTTL, may be incompatible with each other. Often times, the incompatibility is due to the standards having different characteristics for the I/O signal, such as different common-mode voltages and/or different output swings. However, for applications such as PGAs, it may be desirable to have an output driver that supports more than one standard. One approach is to include circuitry that allows the different characteristics of the I/O signal to be programmable.

Figure 1:
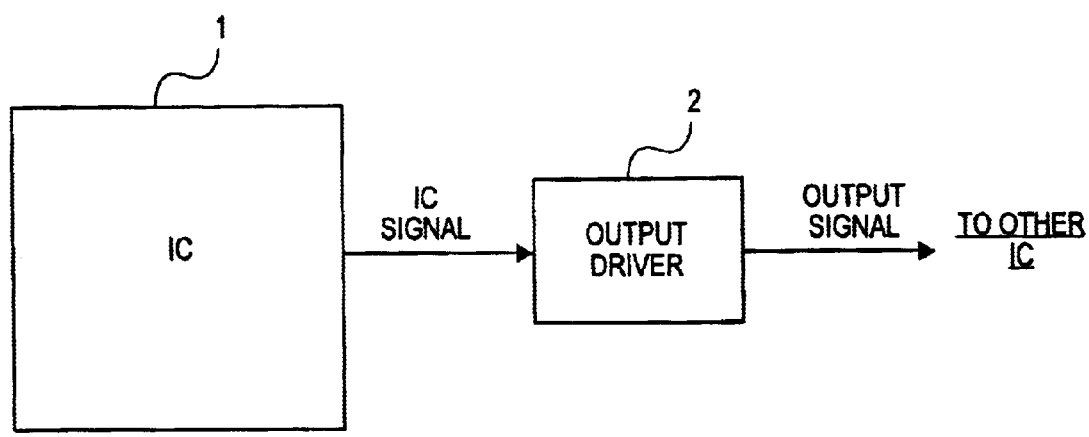
FIG. 1 is a block diagram of an IC coupled with an output driver.
Figure 2:
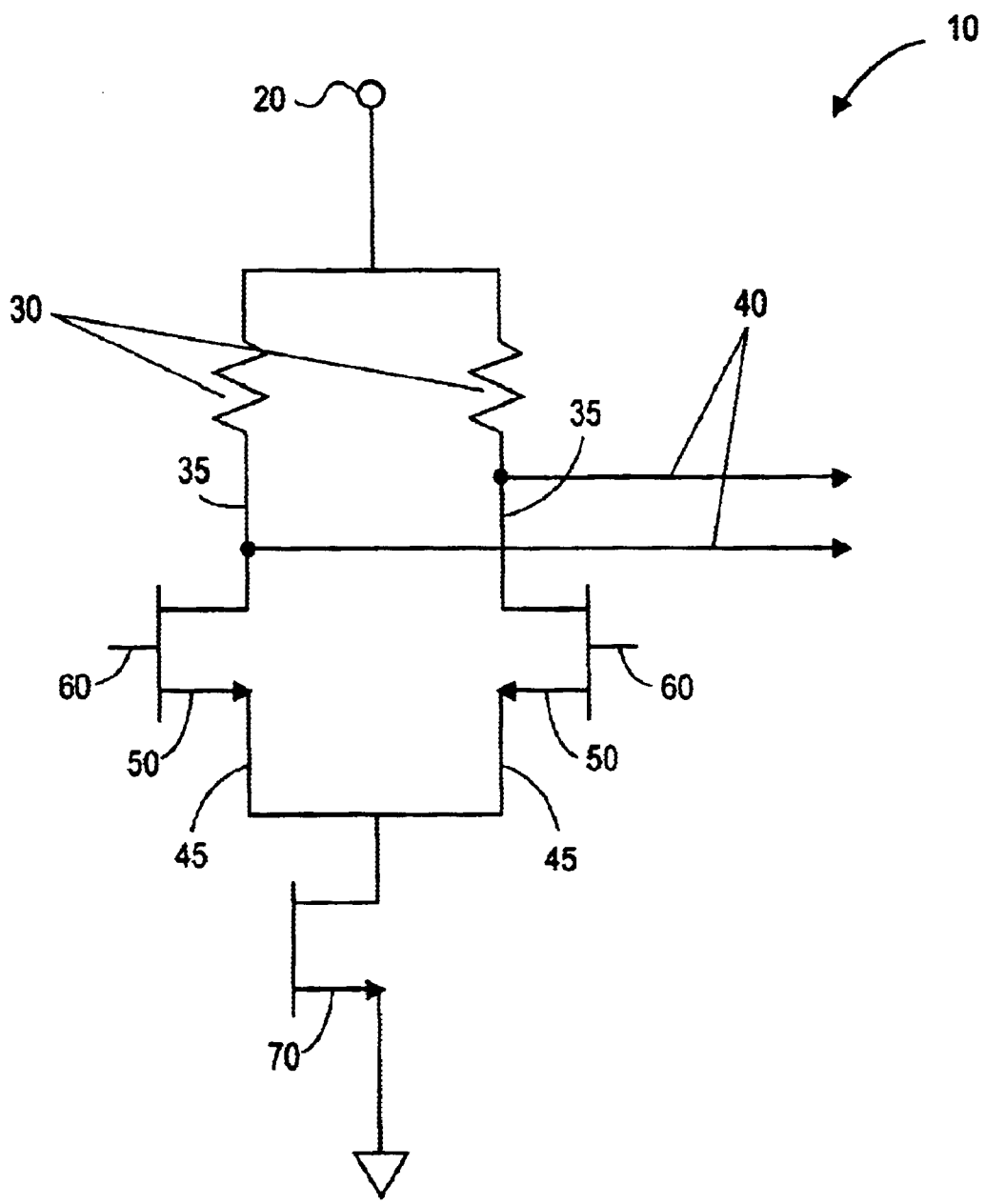
FIG. 2 is a circuit diagram of a portion of a conventional serial line driver.
Figure 3:
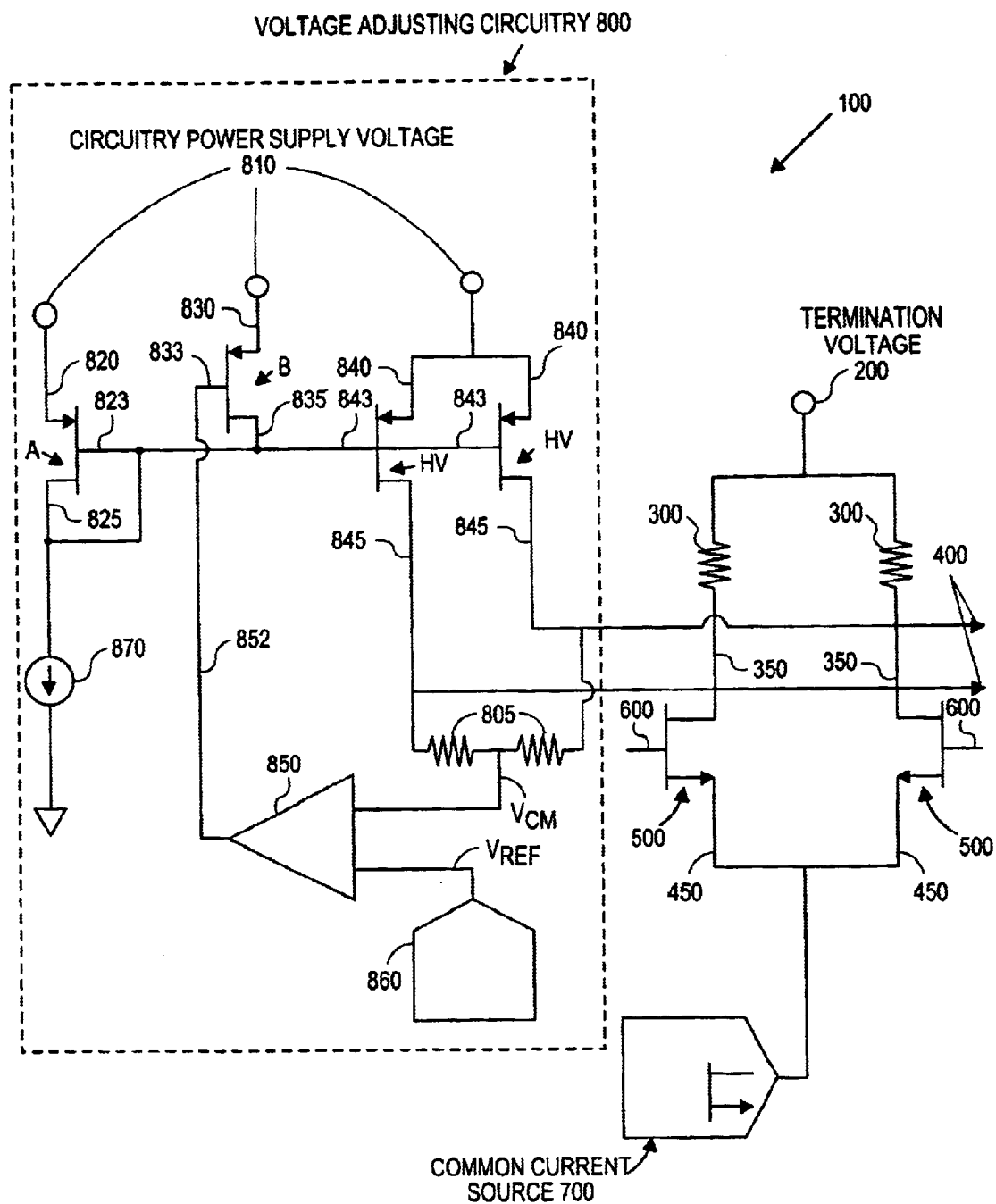
FIG. 3 is a circuit diagram of a portion of a serial line driver in accordance with an embodiment of the present invention.

Turning to FIG. 3, a serial line driver 100 is constructed according to an embodiment of the present invention, wherein the common-mode voltage and the output swing of the output signal 400 for an IC are programmable. The driver 100 includes two I/O NMOS transistors 500 having gates 600 that receive the IC signal as a differential input signal. For digital IC signals, the input signal may be either a high voltage at one gate 600 and a low voltage at the other gate 600 or vice versa, and the input signal may swing between the two values.

The output signal 400 is generated at the drains 350 of the I/O transistors 500 as a differential output signal. A fixed power supply 200 provides the termination voltage for the output signal 400 through two equal size resistors 300, preferably approximately 50 ohms, with one resistor 300 at each drain 350. The fixed power supply 200 provides most of the power used to drive the output signal 400 and may be a low voltage supply, for example, approximately 1.2 volts.

The sources 450 of the I/O transistors 500 are coupled together with a common current source 700. The common current source 700 controls the output swing—the peak-to-peak voltage—of the output signal. The current source 700 is programmable and may include a digital-to-analog converter (DAC) that sets the amount of output swing for the output signal 400 to a particular level.

The output signal 400 is further communicatively coupled to circuitry 800 that allows the common mode voltage—the average voltage across the output signal 400, i.e., between the drains 350 of the I/O transistors 500—to be adjusted to a particular level. The drains 350 of the I/O transistors 500 are coupled to the drains 845 of two high voltage (HV) p-channel MOS transistors. The sources 840 of the HV transistors are coupled to a power supply 810. The HV transistors provide the current source that sets the common-mode voltage of the output signal 400.

In one embodiment, the power used to supply the termination voltage is lower than the power used to set the common-mode voltage of the output signal 400, and the power used to supply the termination voltage constitutes the majority of the power used by the output driver 100. Accordingly, as can be appreciated by one of ordinary skill in the art, a circuit using a lower power supply, e.g., a 1.2 V power supply 200, for providing the termination voltage and a higher power supply, e.g., a 3.3 V power supply 810, for providing the power to set the common mode voltage may save power compared to a circuit that uses a common power supply for both the termination voltage and for setting the common-mode voltage.

The majority of the termination voltage of the output signal 400 comes from the power supply 200. However, the HV transistors may contribute some capacitance to the termination voltage. To minimize the capacitance, it may be desirable to have the HV transistors as small as possible while still being able to supply a sufficient amount of current to set the common-mode voltage of the output signal 400, e.g., the HV transistors may have a length of approximately 0.3 micron and a width of approximately 200 micron.

The gates 843 of the HV transistors are coupled together with the gate 823 of another p-channel transistor A having a fixed current source 870 connected to its drain 825 that provides current flowing away from the drain 825. The transistor A further has its gate 823 and drain 825 connected together. Additionally, the source 820 of transistor A is coupled to power supply 810.

A pair of resistors 805, connected in series, is connected across the output signal 400 in an area between the drains 845 of the HV transistors and the I/O transistors 500. The resistors 805 have equal values, which are preferably high values, e.g. approximately 1000 ohms. The voltage measured between the resistors 805 is the common mode voltage, Vcm, for the output signal 400.

To adjust the value of Vcm, an operational amplifier 850 compares the Vcm with a reference voltage, Vref, which is the desired Vcm value. Vref is programmable and may be set by using a variety of methods and devices. A preferable device is a digital-to-analog converter 860. The output 852 of the operational amplifier 850 is connected to the gate 833 of a transistor B having its drain 835 connected to the gates 823, 843 of transistors A and HV and its source 830 connected to power supply 810.

If the Vcm is higher than Vref, then in order to decrease the Vcm, in one embodiment, the operational amplifier 850 will decrease the voltage to its output 852, thus decreasing the voltage at the gate 833 of transistor B. By virtue of transistor B being a PMOS transistor, the decreased voltage at gate 833 will increase the current flowing out of the drain 835, thus increasing the voltage of the gates 843 of the HV transistors, which in turn, decreases the current flow out of the drains 845. The decreased current supply out of the drains 845 will, in turn, decrease the Vcm of the output signal 400.

If the Vcm is lower than Vref, then in order to increase the Vcm, the operational amplifier 850 will increase the power to its output 852, increasing the voltage at the gate 833 of transistor B. The increased voltage at the gate 833 decreases the current flowing out of the drain 835, which decreases the voltage at the gates 843 of the HV transistors. The decreased voltage at the gates 843 will then increase the current flow out of the drains 845, and thus increase the Vcm of the output signal 400.

If the output signal 400 shorts to ground, then the Vcm will likewise short to ground. In response, the operational amplifier 850 will increase its output 852 in an attempt to raise the Vcm up to Vref. However, if the output signal 400 is shorted to ground, then any current drawn by the output signal 400 is power wasted. To limit the amount of power wasted, the circuit 100 uses a "current mirror."

As mentioned above, if the output signal 400 shorts to ground, the operational amplifier 850 will try to raise Vcm by increasing its output 852 to increase the current flow out of the drains 845 of the HV transistors. But, because Vcm is shorted to ground, the operational amplifier will raise the voltage of gate 833 of transistor B until the voltage reaches close to the power supply 810 voltage. If the voltage difference between the gate 833 voltage and the source 830 voltage, i.e., the power supply voltage 810, is close to zero, transistor B will "turn off" and shut off the current flow out of the drain 835.

As can be appreciated by one of ordinary skill in the art, with transistor B turned off, transistors A and HV together form the current mirror. The source 820 of transistor A and the sources 840 of the HV transistors share the same power supply 810 and the gate 823 of transistor A and the gates 843 of the HV transistors are connected together. Thus, the voltage between the source 820 and gate 823 of transistor A and the voltage between sources 840 and gates 843 of the HV transistors are identical. This creates the current mirror, wherein the current flowing out of the drains 845 of the HV transistors will mirror the current flowing out of the drain 825 of transistor A, which is the current source 870. For example, if the current source 870 produces 10 mA, then the HV transistors will produce 10 mA out of each drain 845. Thus, if the Vcm shorts to ground, then the current drawn by the output signal 400 is limited to current source 870, and the power wasted may be limited.

In an alternative embodiment, the operational amplifier 850 may be coupled directly with the gates 843 of the HV transistors. Thus, in order to increase Vcm, the voltage output 852 of the operational amplifier 850 may decrease, thus decreasing the voltage at the gates 843 of the HV transistors and increasing Vcm. If the Vcm is shorted to ground, then the voltage output 852 of the operational amplifier 850 may drop such that the current mirror is formed as described above. In order to decrease the Vcm, the voltage output 852 of the operational amplifier may increase, thus increasing the voltage at the gates 843 of the HV transistors and decreasing Vcm.

To further save power, each HV transistor may be wider than transistor A. For example, if the HV transistors are ten times wider than transistor A, then in order for the HV transistors to provide 10 mA out of out of each drain 845, the current source 870 need only to produce 1 mA.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions described herein is merely illustrative, and the invention can be performed using different or additional process actions, or a different combination or ordering of process actions. The specification and drawings are, accordingly, to be regarded in an illustrative rather than restrictive sense.

What is claimed is:

1. A method for driving a differential output signal, having a common mode voltage and an output swing for an integrated circuit, comprising:

providing a first power supply for a termination voltage for the differential output signal;

providing a second power supply to adjust the common mode voltage; and adjusting the common mode voltage;

wherein the first power supply generates lower voltage compared to the second power supply.

2. The method of claim 1, further comprising:

adjusting the output swing.

3. The method of claim 1, further comprising:

limiting the amount of current being drawn by the output signal if the output signal is grounded.

4. The method of claim 1, wherein the output signal is digital.

5. The method of claim 1, further comprising:

coupling a current mirror with the output signal to limit the current drawn by the output signal if the output signal is shorted to ground.

6. A method for driving a differential output signal, having a common mode voltage and an output swing, for an integrated circuit, comprising:

selecting a standard having a common mode voltage and an output swing from the group consisting of: a low voltage differential signaling (LVDS) standard and a low voltage transistor to transistor logic (LVTTL) standard;

adjusting the common mode voltage to the common mode voltage of the selected standard; and adjusting the output swing to the output swing of the selected standard.

7. The method of claim 6, further comprising:

limiting the amount of current being drawn by the output signal if the output signal is grounded.

8. The method of claim 6, wherein the output signal is digital.

9. The method of claim 6, further comprising:

coupling a current mirror with the output signal.

10. A circuit for driving a differential output signal, having a common mode voltage and an output swing for an integrated circuit, comprising:

a means for providing a first power supply for a termination voltage for the differential output signal;

a means for providing a second power supply to adjust the common mode voltage; and a means for adjusting the common mode voltage;

wherein the first power supply generates a lower voltage compared to the second power supply.

11. The circuit of claim 10, further comprising:

a means for adjusting the output swing.

12. The circuit of claim 10, further comprising:

a means for limiting the amount of current being drawn by the output signal if the output signal is grounded.

13. The circuit of claim 10, wherein the output signal is digital.

14. A circuit for driving a differential output signal, having a common mode voltage and an output swing, for an integrated circuit, comprising:

means for selecting a standard having a common mode voltage and an output swing from the group consisting of: a low voltage differential signaling (LVDS) standard and a low voltage transistor to transistor logic (LVTTL) standard;

means for adjusting the common mode voltage to the common mode voltage of the selected standard; and means for adjusting the output swing to the output swing of the selected standard.

15. The circuit of claim 14, further comprising:

a means for limiting the amount of current being drawn by the output signal if the output signal is grounded.

16. The circuit of claim 14, wherein the output signal is digital.

17. An apparatus for driving an output signal, having a common mode voltage and an output swing, for an integrated circuit, comprising:

a pair of output terminals, wherein the pair of output terminals provides the output signal;

a first power supply coupled to the pair of output terminals, wherein the first power supply provides a termination voltage for the output signal;

a second power supply coupled to the pair of output terminals, wherein the second power supply provides power to set the common mode voltage for the output signal; and a programmable current source coupled with the pair of output terminals for controlling the output swing.

18. The apparatus of circuit in claim 17, wherein the apparatus drives the output signal in a serial manner.

19. The apparatus of claim 17, wherein the output signal is a differential output signal.

20. The apparatus of claim 17, further comprising:

a current mirror coupled to the second power supply and the pair of output terminals, wherein the current mirror limits the amount of current drawn by the output signal if the output signal shorts to ground.

21. The apparatus of claim 20, wherein the current mirror comprises:

a pair of p-channel metal oxide semiconductor transistors, each coupled with one of the pair of output terminals, wherein the gates of the pair of p-channel transistors are connected together;

a p-channel transistor having its gate connected to the gates of the pair of p-channel transistors and its drain connected to its gate; and a current source coupled to the drain of the p-channel transistor.

22. The apparatus of claim 21, wherein the pair of p-channel transistors are wider than the p-channel transistor.

23. The apparatus of claim 21, further comprising:

an operational amplifier having a voltage reference coupled to the output signal for adjusting the common mode voltage, wherein the output of the operational amplifier is coupled to a p-channel transistor having its drain coupled with the gates of the pair of p-channel transistors.

24. The apparatus of claim 21, further comprising an operational amplifier having a voltage reference coupled to the output signal for adjusting the common mode voltage, wherein the output of the operational amplifier is coupled with the gates of the pair of p-channel transistors.

25. The apparatus of claim 23, wherein the voltage reference is supplied by a digital-to-analog converter.

26. The apparatus of claim 17, wherein the pair of output terminals are the drains of a pair of n-channel metal-oxide semiconductor field-effect transistors.

27. The apparatus of claim 17, wherein the first power supply generates a voltage lower than the second power supply.

28. The method of claim 1, wherein providing the second power supply further comprises providing the second power supply with a programmable voltage to adjust the common mode voltage.

29. The method of claim 1, wherein adjusting the common mode voltage further comprises adjusting the common mode voltage with the programmable voltage of the second power supply.

30. The method of claim 1 further comprising:
providing a programmable current source; and
adjusting the output swing of the output signal with the programmable current source.

31. The circuit of claim 10 wherein said means for providing a second power supply further comprises means for programmably adjusting the common mode voltage.

32. The circuit of claim 10 further comprising means for programmably adjusting the output swing.

* * * * *